United States Patent
Kawabe et al.

(10) Patent No.: US 11,957,055 B2
(45) Date of Patent: Apr. 9, 2024

(54) THERMOELECTRIC TRANSDUCER, THERMOELECTRIC MODULE, BINDER AND METHOD FOR MANUFACTURING THERMOELECTRIC TRANSDUCER

(71) Applicant: Panasonic Intellectual Property Management Co., Ltd., Osaka (JP)

(72) Inventors: Takeshi Kawabe, Osaka (JP); Yuriko Kaneko, Nara (JP); Tsutomu Kanno, Kyoto (JP); Hiromasa Tamaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/960,644

(22) Filed: Oct. 5, 2022

(65) Prior Publication Data

US 2023/0044945 A1 Feb. 9, 2023

Related U.S. Application Data

(63) Continuation of application No. PCT/JP2021/009381, filed on Mar. 9, 2021.

(30) Foreign Application Priority Data

Apr. 10, 2020 (JP) .................... 2020-070679
Dec. 2, 2020 (JP) .................... 2020-199982

(51) Int. Cl.
*H10N 10/17* (2023.01)
*H10N 10/01* (2023.01)
*H10N 10/851* (2023.01)

(52) U.S. Cl.
CPC ............. *H10N 10/17* (2023.02); *H10N 10/01* (2023.02); *H10N 10/851* (2023.02)

(58) Field of Classification Search
CPC ....... H10N 10/17; H10N 10/851; H10N 10/01
See application file for complete search history.

(56) References Cited

U.S. PATENT DOCUMENTS

| | | |
|---|---|---|
| 2004/0102500 A1 | 4/2004 | Fujiwara et al. |
| 2017/0117453 A1 | 4/2017 | Tamaki et al. |
| 2020/0006616 A1 | 1/2020 | Uehara et al. |

FOREIGN PATENT DOCUMENTS

| | | | |
|---|---|---|---|
| JP | H09-293906 A | | 11/1997 |
| JP | H 09293906 A | * | 11/1997 |

(Continued)

OTHER PUBLICATIONS

Moriya Koji, JPH09293906 (A), English Machine Translation, pp. 1-10. (Year: 1997).*

(Continued)

*Primary Examiner* — Tae-Sik Kang
(74) *Attorney, Agent, or Firm* — Rimon P.C.

(57) ABSTRACT

A thermoelectric conversion element includes a P-type thermoelectric conversion layer, a first metal layer, a second metal layer, a first joining layer, and a second joining layer. The P-type thermoelectric conversion layer includes a thermoelectric conversion material containing Mg and at least one selected from the group consisting of Sb and Bi. The first metal layer and the second metal layer each include Cu or a Cu alloy. The first joining layer and the second joining layer each include Al or an Al alloy containing Mg.

7 Claims, 8 Drawing Sheets

(56) References Cited

FOREIGN PATENT DOCUMENTS

| | | |
|---|---|---|
| JP | 6127281 B1 | 4/2017 |
| KR | 2003-0092692 A | 12/2003 |
| WO | 2017/072982 A1 | 5/2017 |
| WO | 2020/003554 A1 | 1/2020 |

OTHER PUBLICATIONS

Cui et al., "Band structure and thermoelectric properties of Al-doped Mg3—xAlxSb2 compounds", Journal of Materials Science: Materials in Electronics (2019) 30:15206-15213. (Year: 2019).*
International Search Report dated Jun. 15, 2021 in International Patent Application No. PCT/JP2021/009381, with English translation.
D. Kraemer et al., "High Thermoelectric Conversion Efficiency of MgAgSb-based Material with Hot-Pressed Contacts," Energy & Environmental Science, 2015, vol. 8, 14 pages, 2015.
Extended European Search Report issued in the corresponding European Patent Application No. 21784577.5, dated Aug. 29, 2023.
Kim et al., "Effect of Ca addition on selective oxidation of Al3Mg2 phase in Al-5 mass% Mg alloy," Materials Letters, vol. 228, pp. 108-111, 2018.

\* cited by examiner

THERMOELECTRIC TRANSDUCER, THERMOELECTRIC MODULE, BINDER AND METHOD FOR MANUFACTURING THERMOELECTRIC TRANSDUCER

This application is a continuation of PCT/JP2021/009381 filed on Mar. 9, 2021, which claims foreign priority of Japanese Patent Applications No. 2020-070679 filed on Apr. 10, 2020 and No. 2020-199982 filed on Dec. 2, 2020, the entire contents of all of which are incorporated herein by reference.

BACKGROUND OF THE INVENTION

1. Field of the Invention

The present disclosure relates to a thermoelectric conversion element, a thermoelectric conversion module, a joining material, and a method of manufacturing a thermoelectric conversion element.

2. Description of Related Art

Thermoelectric conversion elements are known. A thermoelectric conversion module is used in which a P-type thermoelectric conversion element including a P-type thermoelectric conversion material and an N-type thermoelectric conversion element including an N-type thermoelectric conversion material are electrically connected to each other. This thermoelectric conversion module enables electric power generation based on a temperature difference caused by an inflow of thermal energy. To facilitate electrical connection of a thermoelectric conversion element, a metal member is sometimes joined in advance to an edge face portion of a thermoelectric conversion material using a joining material or the like. It is easy to handle or assemble such a thermoelectric conversion element whose edge face portion is a metal member.

D. Kraemer et. al., "High thermoelectric conversion efficiency of MgAgSb-based material with hot-pressed contacts", Energy Environ. Sci., 2015, 8, 1299-1308 discloses a thermoelectric conversion element formed of a MgAgSb-based thermoelectric conversion material and a pair of Ag electrodes joined to the material.

JP 6127281 B1 discloses a MgSbBiTe-based thermoelectric conversion material.

WO 2020/003554 A1 discloses a thermoelectric conversion element formed by joining a MgSbBiTe-based thermoelectric conversion material and a metal member including a CuZn alloy.

SUMMARY OF THE INVENTION

An object of the present disclosure is to provide a thermoelectric conversion element advantageous in keeping the electric resistance value low, by using a thermoelectric conversion material containing Mg and at least one selected from the group consisting of Sb and Bi. Furthermore, an object of the present disclosure is to provide a thermoelectric conversion module including such a thermoelectric conversion element and a method of manufacturing such a thermoelectric conversion element.

The present disclosure provides a thermoelectric conversion element including:
a P-type thermoelectric conversion layer;
a first metal layer;
a second metal layer;
a first joining layer joining a first face of the P-type thermoelectric conversion layer and the first metal layer; and
a second joining layer joining a second face of the P-type thermoelectric conversion layer and the second metal layer, wherein
the P-type thermoelectric conversion layer includes a P-type thermoelectric conversion material, the thermoelectric conversion material containing Mg and at least one selected from the group consisting of Sb and Bi,
the first metal layer and the second metal layer each include Cu or a Cu alloy, and
the first joining layer and the second joining layer each include Al or an Al alloy containing Mg.

The present disclosure can provide a thermoelectric conversion element advantageous in keeping the electric resistance value low, by using a P-type thermoelectric conversion material containing Mg and at least one selected from the group consisting of Sb and Bi.

DETAILED DESCRIPTION (Findings on which the Present Disclosure is Based)

A thermoelectric conversion material containing Mg and at least one selected from the group consisting of Sb and Bi can exhibit high thermoelectric conversion properties at up to approximately 400° C. On the other hand, at 527° C. or higher, such a thermoelectric conversion material containing Mg and at least one selected from the group consisting of Sb and Bi degrades due to decomposition of the compound. Consequently, the thermoelectric conversion properties deteriorate.

Furthermore, in producing an N-type thermoelectric conversion element by joining a metal member to an edge face of an N-type thermoelectric conversion material containing Mg, Sb, and Bi, loss of Mg occurs in the N-type thermoelectric conversion material due to diffusion of Mg contained in the N-type thermoelectric conversion material. Consequently, the thermoelectric conversion properties deteriorate.

According to studies by the present inventors, in producing a P-type thermoelectric conversion element by joining a metal member to an edge face of a P-type thermoelectric conversion material containing Mg and at least one selected from the group consisting of Sb and Bi, diffusion of Mg contained in the P-type thermoelectric conversion material exerts a small influence on the thermoelectric properties. Accordingly, the selection criteria for a joining material used for producing a P-type thermoelectric conversion element are that the joining material has heat resistance to up to the maximum use temperature for the element and that the joining material can be joined at the temperature of 520° C. or lower at which the element does not degrade.

Further studies by the present inventors found Ag, Al, and an Al alloy as the joining material satisfying the selection criteria. However, it was found that using Ag as the joining material generates a porous region at the joining interface between Ag and the P-type thermoelectric conversion material to increase the interfacial resistance. Therefore, in selecting the joining material, a further improvement is required such that the interfacial resistance does not increase at the joining interface between the joining material and the thermoelectric conversion material or at the joining interface between the joining material and the metal member.

The MgAgSb-based thermoelectric conversion material disclosed in D. Kraemer et. al., "High thermoelectric conversion efficiency of MgAgSb-based material with hot-pressed contacts", Energy Environ. Sci., 2015, 8, 1299-1308 has edge faces to which the metal members formed of Ag electrodes are joined. However, no report is made on an increase in interfacial resistance at the joining interfaces.

Furthermore, the MgSbBiTe-based thermoelectric conversion material disclosed in WO 2020/003554 A1 has edge faces to which the metal members formed of CuZn alloy electrodes are joined. However, no report is made on the selection criteria for the joining material for the P-type thermoelectric conversion material.

In addition, it was found that using an Al alloy containing Si among Al alloys as the joining material achieves favorable initial characteristics after joining, but causes decomposition of the element by heating at the maximum use temperature for the element.

Based on these studies, it was newly found that selecting Al or an Al alloy containing Mg as a joining material enhances the joining properties between a thermoelectric conversion material containing Mg and at least one selected from the group consisting of Sb and Bi and a metal member at a joining temperature of 520° C. or lower. As a result, a thermoelectric conversion element advantageous in keeping the electric resistance value low can be obtained.

(Embodiments of the Present Disclosure)

Hereinafter, embodiments of the present disclosure will be described with reference to the drawings.

(Thermoelectric Conversion Element)

Figure 1:
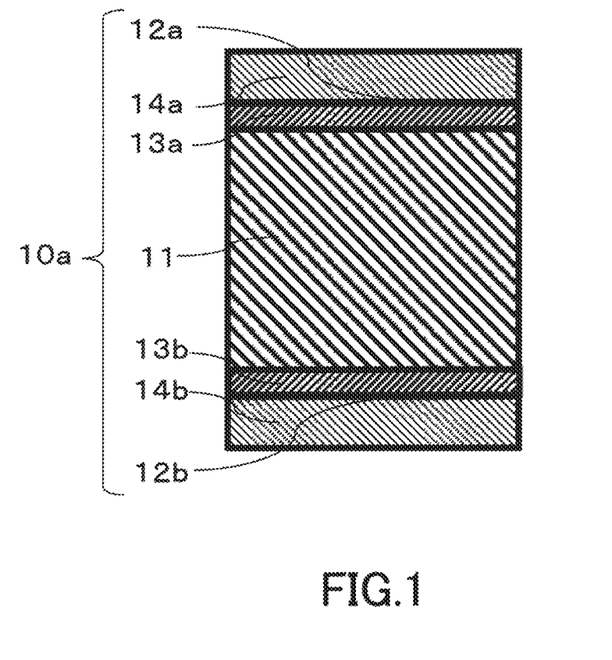
FIG. 1 is a schematic diagram showing an example of a thermoelectric conversion element of the present disclosure.

FIG. 1 is a schematic diagram showing an example of a thermoelectric conversion element of an embodiment of the present disclosure. A P-type thermoelectric conversion element 10a shown in FIG. 1 includes a P-type thermoelectric conversion layer 11, a first metal layer 14a, a second metal layer 14b, a first joining layer 13a, and a second joining layer 13b. The first joining layer 13a joins a first face 12a of the P-type thermoelectric conversion layer 11 and the first metal layer 14a. The second joining layer 13b joins a second face 12b of the P-type thermoelectric conversion layer 11 and the second metal layer 14b.

As shown in FIG. 1, the shape of the P-type thermoelectric conversion element 10a is, for example, a rectangular parallelepiped. The shape of the P-type thermoelectric conversion element 10a may be, for example, a cube, other prism, a cylinder, or a column as long as the P-type thermoelectric conversion element 10a has a three-dimensional shape capable of layer formation.

[Thermoelectric Conversion Layer]

The P-type thermoelectric conversion layer 11 is a middle layer portion of the P-type thermoelectric conversion element 10a. The thickness of the P-type thermoelectric conversion element 10a is, for example, 0.5 mm or more and 5.0 mm or less.

The P-type thermoelectric conversion layer 11 includes a thermoelectric conversion material containing Mg and at least one selected from the group consisting of Sb and Bi. This thermoelectric conversion material may contain Mg, Sb, and Bi.

The composition of the P-type thermoelectric conversion material of the present embodiment is not limited to any particular composition as long as Mg and at least one selected from the group consisting of Sb and Bi are contained. The composition of this thermoelectric conversion material is represented by, for example, Formula (1): $Mg_{3-m}A_aB_bD_2E_e$ or Formula (2): $Mg_{3-m}A_aB_bD_{2e}E_e$.

In Formula (1), the element A is at least one selected from the group consisting of Ca, Sr, Ba, and Yb. The element B is at least one selected from the group consisting of Mn and Zn. The element D is at least one selected from the group consisting of Sb and Bi. The element E is at least one selected from the group consisting of Na, Li, and Ag.

In Formula (1), the value of m is −0.39 or more and 0.42 or less. The value of a is 0 or more and 0.12 or less. The value of b is 0 or more and 0.48 or less. The value of e is 0.001 or more and 0.06 or less.

In Formula (2), the element A is at least one selected from the group consisting of Ca, Sr, Ba, and Yb. The element B is at least one selected from the group consisting of Mn and Zn. The element D is at least one selected from the group consisting of Sb and Bi. The element E is Pb.

In Formula (2), the value of m is −0.39 or more and 0 or less. The value of a is 0 or more and 0.12 or less. The value of b is 0 or more and 0.48 or less. The value of e is 0.001 or more and 0.06 or less.

The P-type thermoelectric conversion material of the present embodiment can have, for example, any composition within the ranges of Formula (1) and Formula (2).

The P-type thermoelectric conversion material is desirably a $Mg_3(Sb,Bi)_2$-based P-type thermoelectric conversion material. A $Mg_3(Sb,Bi)_2$-based thermoelectric conversion material includes $Mg_3(Sb,Bi)_2$ and a material in which part of elements of $Mg_3(Sb,Bi)_2$ is substituted by other element. In the case where the $Mg_3(Sb,Bi)_2$-based thermoelectric conversion material is a material in which part of elements of $Mg_3(Sb,Bi)_2$ is substituted by other element, the content of the other element is less than the content of Mg and is less than the sum of the content of Sb and the content of Bi on an amount-of-substance basis. The P-type thermoelectric conversion material may contain Na as a dopant. In the present description, the expression "(Sb,Bi)" means at least one selected from the group consisting of Sb and Bi.

The P-type thermoelectric conversion material of the present embodiment has, for example, a $La_2O_3$-type crystal structure.

Figure 2:
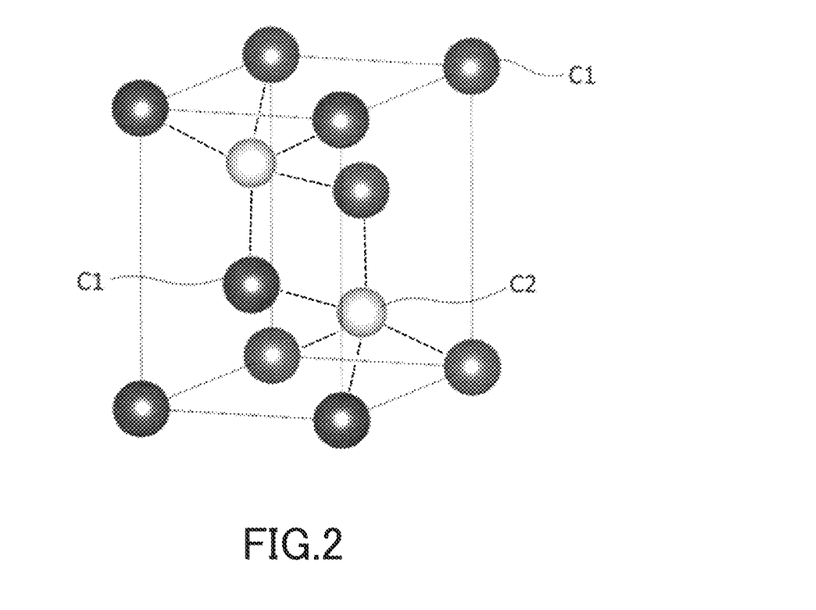
FIG. 2 is a schematic diagram of a $La_2O_3$-type crystal structure of the present disclosure.

FIG. 2 is a schematic diagram of a $La_2O_3$-type crystal structure. The P-type thermoelectric conversion material of the present embodiment may be monocrystalline, or may be polycrystalline. The $La_2O_3$-type crystal structure of the P-type thermoelectric conversion material of the present embodiment was elucidated by X-ray diffraction measurement. According to the results of the X-ray diffraction measurement, Mg is located at the C1 site, and at least one element selected from the group consisting of Sb and Bi is located at the C2 site. The C1 site and the C2 site form a bond as indicated by broken lines in FIG. 2.

[Metal Layer]

The first metal layer 14a and the second metal layer 14b shown in FIG. 1 are each an edge face portion of the P-type thermoelectric conversion element 10a. The respective thicknesses of the first metal layer 14a and the second metal layer 14b are, for example, 0.005 mm or more and 0.3 mm or less, and may be 0.005 mm or more and 0.2 mm or less. The respective thicknesses of these layers may be the same, or may be different from each other.

The first metal layer 14a and the second metal layer 14b each contain a simple substance of Cu or a Cu alloy. The Cu alloy is, for example, brass, red brass, gilding metal, phosphor bronze, Muntz metal, aluminum bronze, beryllium copper, nickel silver, or cupronickel. The composition of the first metal layer 14a and the composition of the second metal layer 14b may be the same, or may be different from each other. The first metal layer 14a and the second metal layer 14b each may be a simple substance of Cu or a Cu alloy containing Au, Pt, Ag, Fe, Ni, Ti, or the like.

[Joining Layer]

As shown in FIG. 1, the first joining layer 13a is positioned between the first face 12a of the P-type thermoelectric conversion layer 11 and the first metal layer 14a. The first joining layer 13a is desirably in direct contact with the first face 12a of the P-type thermoelectric conversion layer 11. The first joining layer 13a may be in direct contact with the first metal layer 14a, or may not be in direct contact with the first metal layer 14a by interposition of a diffusion layer or the like. The second joining layer 13b is positioned between the second face 12b of the P-type thermoelectric conversion layer 11 and the second metal layer 14b. The second joining layer 13b is desirably in direct contact with the second face 12b of the P-type thermoelectric conversion layer 11. The second joining layer 13b may be in direct contact with the second metal layer 14b, or may not be in direct contact with the second metal layer 14b by interposition of a diffusion layer or the like. The respective thicknesses of the first joining layer 13a and the second joining layer 13b are, for example, 0.01 mm or more and 0.3 mm or less.

The first joining layer 13a and the second joining layer 13b are each Al or an Al alloy containing Mg. The composition of the first joining layer 13a and the composition of the second joining layer 13b may be the same, or may be different from each other. In the case where the first joining layer 13a and the second joining layer 13b are each an Al alloy containing Mg, the joining temperature can be decreased to be low owing to Mg contained, compared with the case where the first joining layer 13a and the second joining layer 13b are each a simple substance of Al. In the case where the first joining layer 13a and the second joining layer 13b are each an Al alloy containing Mg, the content of Mg in the Al alloy is not limited to any particular value. In the case where the first joining layer 13a and the second joining layer 13b are each an Al alloy containing Mg, the content of Mg in the Al alloy is desirably more than 0.0 atm % and 70.0 atm % or less. The content of Mg is more desirably 30.0 atm % or more and 70.0 atm % or less.

The Al alloy may further contain Ca. The Al alloy containing Mg may contain a trace amount of impurities. The content of the impurities in the Al alloy is desirably 0 atm % or more and 0.3 atm % or less. Even in the case where the content of the impurities in the Al alloy is 1 atm % or less, the effects of the present application are not impaired. Owing to impurities contained, the oxide film is reduced and thus the joining properties can be increased. Furthermore, the melting point of the Al alloy containing Mg can be further decreased in some cases. In the present embodiment, Ca may be contained as the impurities. Ca is an example of the impurities in the Al alloy, and C, Na, Li, Ba, Zn, Sr, or the like may be used as the impurities in the Al alloy.

The relationship between the thickness of the P-type thermoelectric conversion layer 11, the thickness of the first joining layer 13a, the thickness of the second joining layer 13b, the thickness of the first metal layer 14a, and the thickness of the second metal layer 14b is not limited to any particular relationship. The relationship can vary depending on the method of joining the thermoelectric conversion element, the place where the thermoelectric conversion element is used, the method of using the thermoelectric conversion element, or the like. When the thickness of the P-type thermoelectric conversion layer 11 is defined as 1, the thickness of the first joining layer 13a and the thickness of the second joining layer 13b are each, for example, 0.20 or more and 0.25 or less, and the thickness of the first metal layer 14a and the thickness of the second metal layer 14b are each, for example, 0.070 to 0.075.

(Thermoelectric Conversion Module)

Figure 3:
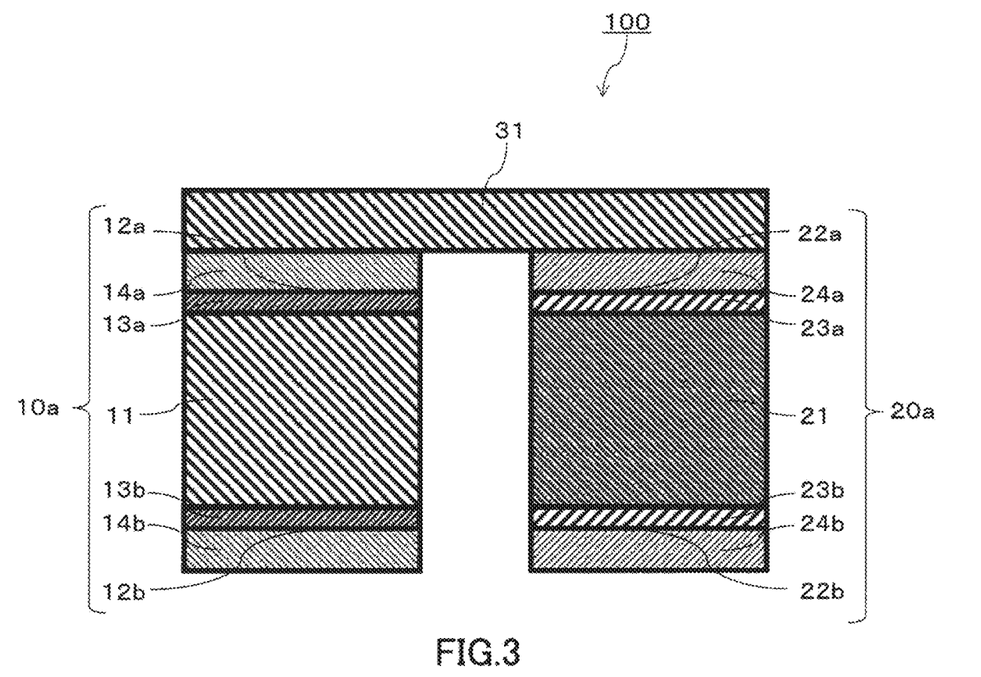
FIG. 3 is a schematic diagram showing an example of a thermoelectric conversion module of the present disclosure.

FIG. 3 shows an example of a thermoelectric conversion module of the present embodiment. As shown in FIG. 3, a thermoelectric conversion module 100 includes an N-type thermoelectric conversion element 20a and the P-type thermoelectric conversion element 10a shown in FIG. 1. The P-type thermoelectric conversion element 10a and the N-type thermoelectric conversion element 20a are electrically connected in series. The P-type thermoelectric conversion element 10a and the N-type thermoelectric conversion element 20a are electrically connected to each other by, for example, an external electrode 31.

As shown in FIG. 3, the N-type thermoelectric conversion element 20a includes an N-type thermoelectric conversion layer 21, a third metal layer 24a, a fourth metal layer 24b, a third joining layer 23a, and a fourth joining layer 23b. The third joining layer 23a joins a third face 22a of the N-type thermoelectric conversion layer 21 and the third metal layer 24a. The fourth joining layer 23b joins a fourth face 22b of the N-type thermoelectric conversion layer 21 and the fourth metal layer 24b.

The N-type thermoelectric conversion layer 21 of the present embodiment incudes, for example, an N-type thermoelectric conversion material containing Mg and at least one selected from the group consisting of Sb and Bi.

In the thermoelectric conversion module 100, the P-type thermoelectric conversion material and the N-type thermoelectric conversion material in pairs may be the same or may be different from each other in terms of the ratio of the number of atoms of contained Sb and Bi. In the case where the ratio of the number of atoms is the same, the difference in thermal expansion between the P-type thermoelectric conversion material and the N-type thermoelectric conversion material is likely to be small. Therefore, a thermal stress generated in the thermoelectric conversion module is likely to be reduced.

The composition of the N-type thermoelectric conversion material of the present embodiment is not limited to any particular composition. The composition of the N-type thermoelectric conversion material of the present embodiment is represented by, for example, Formula (3): $Mg_{3+m}R_aT_bX_{2-e}Z_e$. In Formula (3), the element R is at least one selected from the group consisting of Ca, Sr, Ba, and Yb. The element T is at least one selected from the group consisting of Mn and Zn. The element X is at least one selected from the group consisting of Sb and Bi. The element Z is at least one selected from the group consisting of Se and Te. In Formula (3), the value of m is −0.39 or more and 0.42 or less. The value of a is 0 or more and 0.12 or less. The value of b is 0 or more and 0.48 or less. The value of e is 0.001 or more and 0.06 or less. The N-type thermoelectric conversion material of the present embodiment can have any composition within the range of Formula (3). The N-type thermoelectric conversion material of the present embodiment is desirably a $Mg_3(Sb,Bi)_2$-based thermoelectric conversion material. The N-type thermoelectric conversion material may be represented by a chemical formula of $Mg_{3.2}Sb_{1.5}Bi_{0.49}Te_{0.01}$.

In the present embodiment, the N-type thermoelectric conversion material also has a $La_2O_3$-type crystal structure. In this case, the N-type thermoelectric conversion material may be monocrystalline, or may be polycrystalline.

The third metal layer 24a and the fourth metal layer 24b are each an edge face portion of the N-type thermoelectric conversion element 20a. The respective thicknesses of the third metal layer 24a and the fourth metal layer 24b are, for example, 0.005 mm or more and 2 mm or less. The respective thicknesses of the third metal layer 24a and the fourth metal layer 24b may be the same, or may be different from each other. The composition of the third metal layer 24a and the composition of the fourth metal layer 24b may be respectively the same as the composition of the first metal layer 14a and the composition of the second metal layer 14b. In this case, electrical connection to the external electrode can be simplified.

Figure 4:
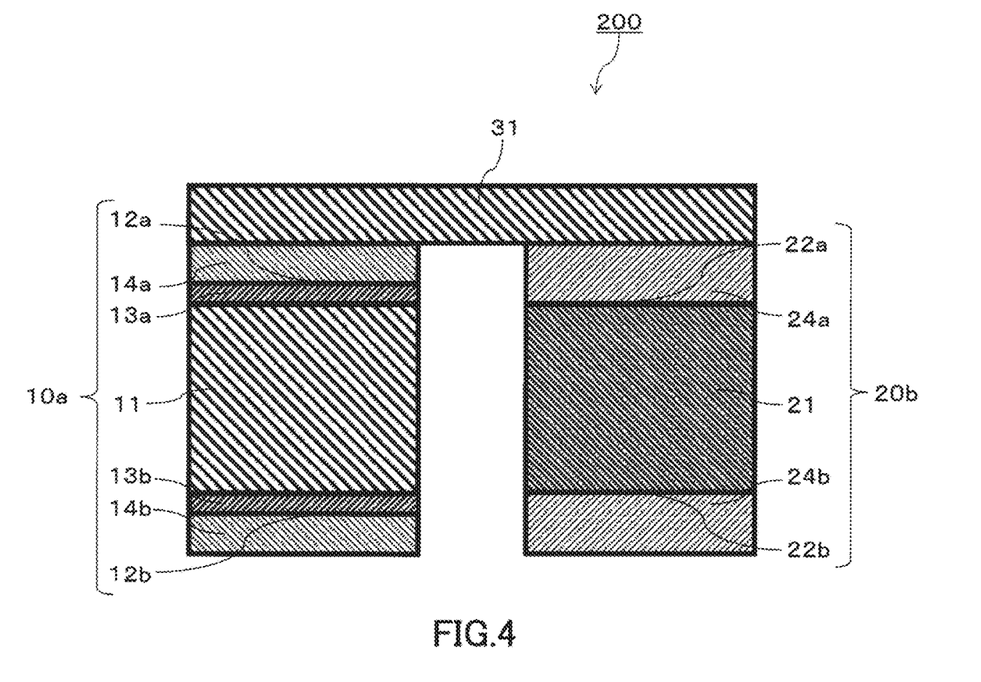
FIG. 4 is a schematic diagram showing a modification of the thermoelectric conversion module of the present disclosure.

FIG. 4 shows a modification of the thermoelectric conversion module of the present embodiment. As shown in FIG. 4, a thermoelectric conversion module 200 includes an N-type thermoelectric conversion element 20b and the P-type thermoelectric conversion element 10a shown in FIG. 1. The P-type thermoelectric conversion element 10a and the N-type thermoelectric conversion element 20b are electrically connected in series. The P-type thermoelectric conversion element 10a and the N-type thermoelectric conversion element 20b are electrically connected to each other by, for example, the external electrode 31.

The N-type thermoelectric conversion element 20b includes the N-type thermoelectric conversion layer 21, the third metal layer 24a, and the fourth metal layer 24b. As shown in FIG. 4, in the N-type thermoelectric conversion element 20b, the third face 22a of the N-type thermoelectric conversion layer 21 and the third metal layer 24a are directly joined to each other. Similarly, the fourth face 22b of the N-type thermoelectric conversion layer 21 and the fourth metal layer 24b are directly joined to each other.

In other words, in the thermoelectric conversion module of the present embodiment, as in the thermoelectric conversion module 100 of FIG. 3, both the P-type thermoelectric conversion element 10a and the N-type thermoelectric conversion element 20a each may include joining layers. Alternatively, in the thermoelectric conversion module of the present embodiment, as in the thermoelectric conversion module 200 of FIG. 4, only the P-type thermoelectric conversion element 10a may include joining layers.

Figure 5:
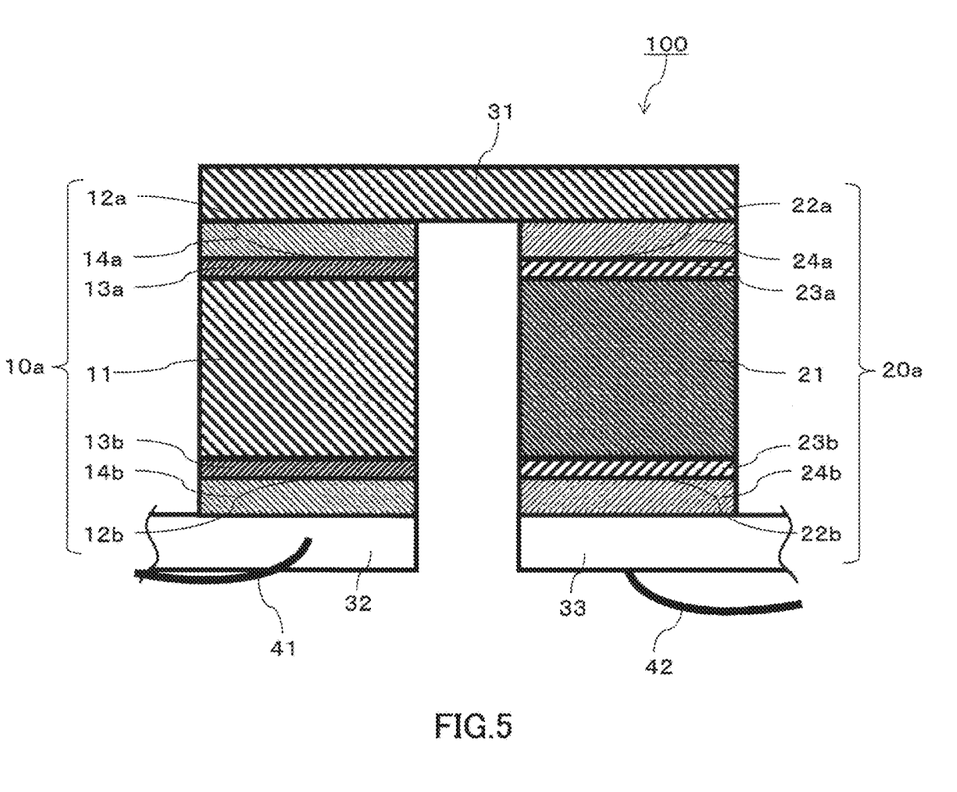
FIG. 5 is a schematic diagram showing an example of the thermoelectric conversion module of the present disclosure in use.

FIG. 5 shows an example of the thermoelectric conversion module 100 of the present embodiment in use. The P-type thermoelectric conversion element 10a is electrically connected to an external electrode 32 by the second metal layer 14b. In contrast, the N-type thermoelectric conversion element 20a is electrically connected to an external electrode 33 by the fourth metal layer 24b. A first wiring 41 and a second wiring 42 play a role of externally extracting an electric power generated in the P-type thermoelectric conversion element 10a and the N-type thermoelectric conversion element 20a. The first wiring 41 is connected to the external electrode 32, and the second wiring 42 is connected to the external electrode 33.

(Manufacturing Methods)

[Method of Manufacturing Thermoelectric Conversion Material]

Respective materials of the thermoelectric conversion layer, the first metal layer, the second metal layer, the first joining layer, and the second joining layer are produced. These materials may be produced by a method such as a method of producing the thermoelectric conversion material of the thermoelectric conversion layer. Alternatively, commercially-available materials may be used as these materials.

The following describes an example of a method of manufacturing the thermoelectric conversion material of the present embodiment. However, the method of manufacturing the thermoelectric conversion material of the present embodiment is not limited to the following example.

First, a raw material, including Mg particles, Sb particles, Bi particles, and a powder of a doping material A, is subjected to a solid phase reaction. Thus, a powder of a MgSbBiA precursor alloy is obtained. The method for the solid phase reaction is, for example, mechanical alloying. The raw material powder is put into a mill pot and is mechanically milled. The milling atmosphere is an inert gas atmosphere. This can suppress oxidation of the raw material. The inert gas is, for example, argon or helium. In addition, another method, such as a melting method, may be used as the method for the solid phase reaction.

Next, the MgSbBiA precursor alloy is sintered to obtain a MgSbBiA monocrystal or polycrystal. Employable for sintering is, for example, a spark plasma sintering method or a hot press method. The obtained sintered body, with no treatment added, may be used as a thermoelectric conversion material. Alternatively, the obtained sintered body may be subjected to a heat treatment. In this case, the heat-treated sintered body can be used also as a thermoelectric conversion material.

[Methods of Manufacturing Thermoelectric Conversion Element and Thermoelectric Conversion Module]

Figure 6:
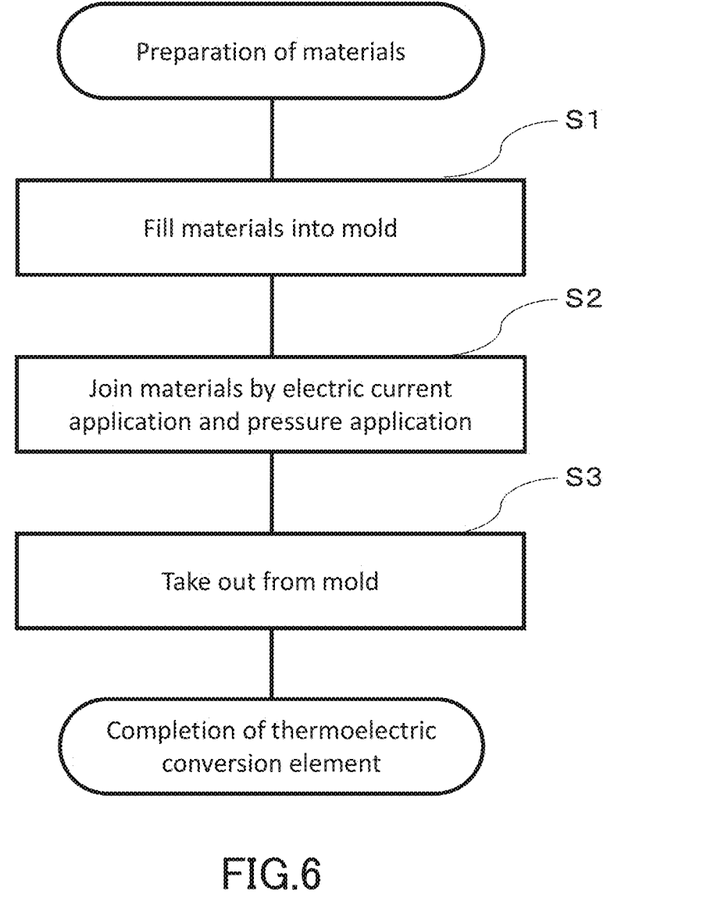
FIG. 6 is a process diagram of a method of manufacturing the thermoelectric conversion element of the present disclosure.

FIG. 6 shows a process diagram of a method of manufacturing the thermoelectric conversion element of the present embodiment.

Figure 7:
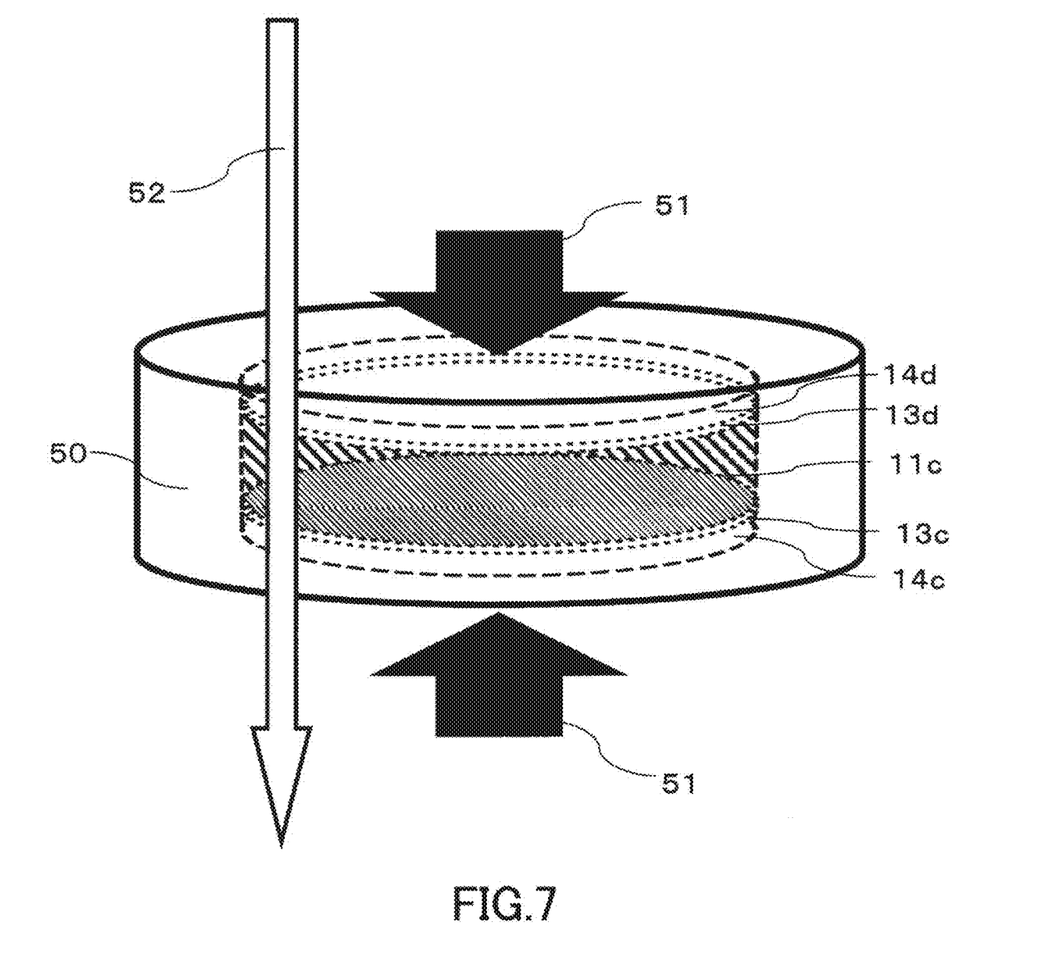
FIG. 7 is a schematic diagram showing an example of the method of manufacturing the thermoelectric conversion element of the present disclosure.

FIG. 7 shows an example of the method of manufacturing the thermoelectric conversion element of the present embodiment. This method will be described below.

However, the method of manufacturing the thermoelectric conversion element of the present embodiment is not limited to the following examples.

In Step S1 in FIG. 6, a material 14c of the first metal layer, a material 13c of the first joining layer, a material 11c of the P-type thermoelectric conversion layer, a material 13d of the second joining layer, and a material 14d of the second metal layer are filled in this order into a mold 50 shown in FIG. 7. This filling is performed in an inert atmosphere. The material 11c of the P-type thermoelectric conversion layer had been subjected, after sintering, to a treatment for removing a surface oxide film. By sintering the thermoelectric conversion material in advance and then joining the layers, the sintering temperature of the thermoelectric conversion material can be increased to be higher than 500° C. In the case where the sintering temperature is higher than 500° C., the thermoelectric conversion material is a polycrystal. Accordingly, maintaining such a high temperature after generation of the polycrystal coarsens crystal grains. That is, grain growth occurs. In some cases, a thermoelectric conversion material including grown crystal grains enhances thermoelectric properties. The joining temperature is desirably 280° C. to 520° C., more desirably 330° C. to 520° C., and even more desirably 380° C. to 520° C.

Furthermore, an improvement may be made on the shapes of the layers to increase the contact area between the materials of the layers. For example, in the case where the thermoelectric conversion material of the thermoelectric conversion layer has been sintered in advance, it is conceivable to form the materials of the first joining layer and the second joining layer so as to be powdery and to form the materials of the first metal layer and the second metal layer so as to be plate-like, massive, or powdery. In the case where a thermoelectric conversion element substrate that is a large thermoelectric conversion element is produced and is cut into a plurality of thermoelectric conversion elements, such an improvement on the shape enhances the yield of the resultant thermoelectric conversion elements.

Next, in Step S2, the above materials filled into the mold 50 are subjected to heating at a predetermined temperature and pressure application to obtain a joined body. For example, in an inert atmosphere, a pressure is applied to the materials in pressure application directions 51 indicated by black arrows, and an electric current 52 corresponding to the joining temperature is applied in a direction indicated by a white arrow. Thus, the materials are sintered. Employable for sintering is, for example, a spark plasma sintering method or a hot press method.

Finally, in Step S3, a laminate obtained by joining accompanied by sintering, namely, a thermoelectric conversion element, is taken out from the mold 50.

Figure 8:
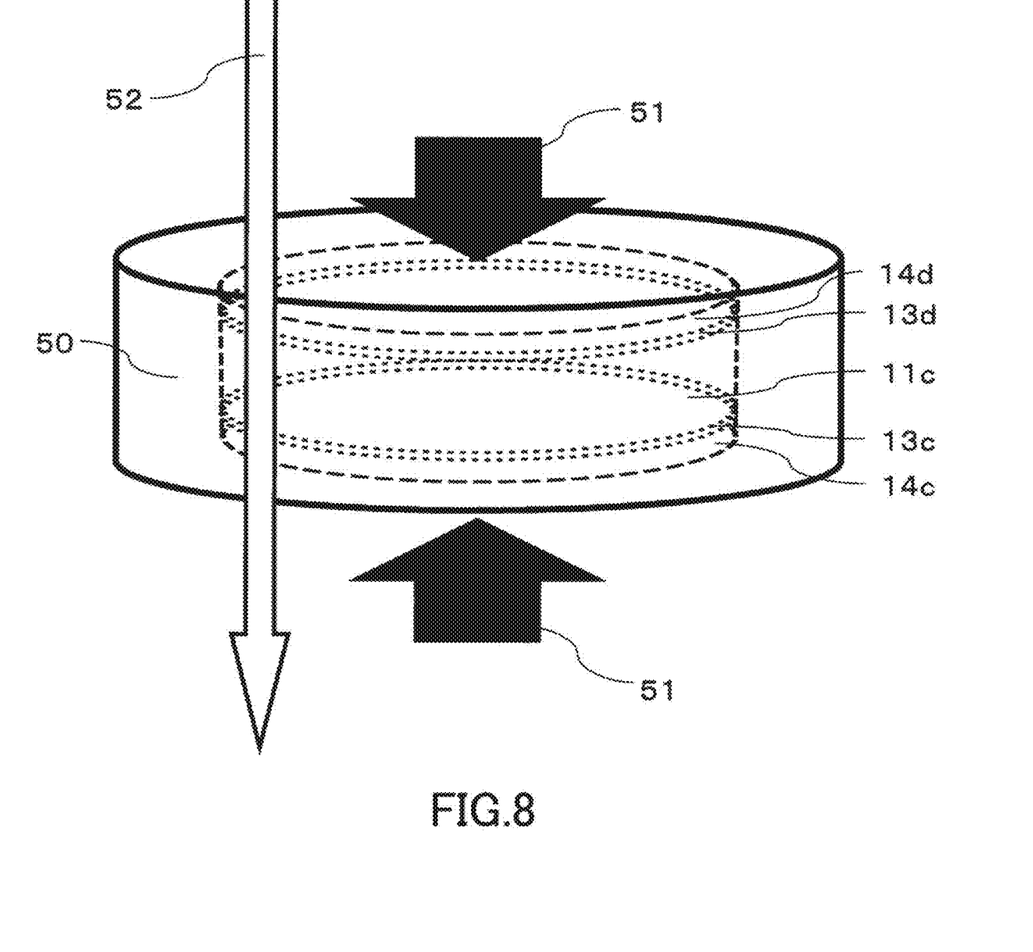
FIG. 8 is a schematic diagram showing a modification of the method of manufacturing the thermoelectric conversion element of the present disclosure.

FIG. 8 shows a modification of the method of manufacturing the thermoelectric conversion element of the present embodiment. In the manufacturing method shown in FIG. 8, a powder of a MgSbBiA precursor alloy before sintering is used as the material of the thermoelectric conversion layer.

In other words, the material 14c of the first metal layer, the material 13c of the first joining layer, the material 11c of the P-type thermoelectric conversion layer, the material 13d of the first joining layer, and the material 14d of the first metal layer are filled in this order into the mold 50. This filling is performed in an inert atmosphere. Then, a pressure is applied to the materials in the pressure application directions 51 indicated by the black arrows, and the electric current 52 corresponding to the joining temperature is applied in the direction indicated by the white arrow. Thus, the materials are joined. Employable for sintering is, for example, a spark plasma sintering method or a hot press method. According to the present modification, sintering of the thermoelectric conversion material and joining of the thermoelectric conversion layer and the metal layers can be performed at a time, thereby simplifying the process.

In the method of manufacturing the thermoelectric conversion element of the present embodiment shown in FIG. 7 and FIG. 8, the materials are joined by applying a pressure to the materials in the pressure application directions 51, which are the upward direction and the downward direction, indicated by the black arrows. The magnitude of the pressure application in the upward direction and the downward direction is the same. The following two cases are the same or different from each other in terms of magnitude of the pressure application: the case shown in FIG. 7 where sintering of the thermoelectric conversion material and joining of the thermoelectric conversion layer and the metal layers are performed separately; and the case shown in FIG. 8 where sintering of the thermoelectric conversion material and joining of the thermoelectric conversion layer and the metal layers are performed at a time.

In FIG. 7 and FIG. 8, after joining of the thermoelectric conversion layer with each of the first metal layer and the second metal layer (Step S2), an annealing treatment may be performed in an inert atmosphere to remove a residual stress for homogenization inside the thermoelectric conversion element.

Assembly and manufacture of the thermoelectric conversion modules 100 and 200 can be performed by a known method with use of the N-type thermoelectric conversion element 20a or 20b and the P-type thermoelectric conversion element 10a.

[Analysis and Evaluation on Compositions of Layers of Thermoelectric Conversion Material after Sintering and Thermoelectric Conversion Element after Joining]

Analysis and evaluation can be performed on the compositions of the layers of the thermoelectric conversion material after sintering and the thermoelectric conversion element after joining. The method for the analysis and evaluation on compositions is, for example, energy dispersive X-ray spectroscopy, X-ray photoelectron spectroscopy, or inductively coupled plasma optical emission spectroscopy. These methods are applicable to the thermoelectric conversion module after manufacture as well.

The application of the thermoelectric conversion element of the present embodiment is not limited. The thermoelectric conversion element of the present embodiment can for example be used for various applications including applications of conventional thermoelectric conversion elements.

EXAMPLES

Example 1

[Production of P-Type Thermoelectric Conversion Layer]

In a glove box, approximately 1 g of $Mg_{2.99}Na_{0.01}Sb_{1.0}Bi_{1.0}$ produced by a solid phase reaction was weighed. The inside of the glove box had been controlled to an argon atmosphere until a thermoelectric conversion material was obtained. Next, the weighed powder was filled into a sintering space of a carbon die and was compacted with a carbon punch. The die was a sintering mold having a diameter of 10 mm.

Next, the die was placed in a chamber of a spark plasma sintering apparatus. The chamber was controlled to an argon atmosphere. Next, while a pressure of 50 MPa was applied to the filling in the die, an electric current was applied to the die with the sintering apparatus. After the temperature of the die reached 680° C. which is the sintering temperature by the application of the electric current, the temperature was maintained for 10 minutes. Then, the heating was stopped by gradually reducing the electric current. After confirmation that the temperature of the die had decreased to room temperature, a sintered body was taken out from the die. A surface oxidized layer, defining a contact surface of the sintered body as a thermoelectric conversion material which had been in contact with the sintering mold, was polished. Then, the sintered body was washed with acetone. The sintered body had a thickness of approximately 2.4 mm.

[Joining of Materials]

The thermoelectric conversion material whose surface oxidized layer had been polished, Cu plates washed with acetone, and a MgAlCa powder manufactured by HIKARI MATERIAL INDUSTRY CO., LTD were transferred into the glove box. The Cu plates each had a diameter of 10 mm and a thickness of 0.2 mm. The MgAlCa powder contained 32.2% of Al, 0.2% of Ca, and 67.6% of Mg on a mass basis. In the glove box, one Cu plate, approximately 0.07 g of the MgAlCa powder, the thermoelectric conversion material, the MgAlCa powder, and one Cu plate were filled in this order into a sintering space of a carbon die (mold), and were compacted with a punch. The Cu plates served as the material of the metal layers, and the MgAlCa powder served as the material of the joining layers.

Next, the die was placed in a chamber of a spark plasma sintering apparatus. The chamber had been controlled to an argon atmosphere. Next, while a pressure of 50 MPa was applied to the filling in the die, an electric current was applied to the die with the sintering apparatus. After the temperature of the die reached 400° C. which is the maximum joining temperature by the application of the electric current, the temperature was maintained for 5 minutes. Then, the heating of the die was stopped by gradually reducing the electric current. After the temperature of the die decreased to room temperature, a thermoelectric conversion element substrate which is a laminate was taken out from the die.

[Production of Thermoelectric Conversion Element]

The thermoelectric conversion element substrate after sintering was cut out with a diamond cutter to produce thermoelectric conversion elements. The electric resistance value of the thermoelectric conversion element was measured by the four-terminal measurement method with SourceMeter (model number: 2400) manufactured by KEITHLEY INSTRUMENTS. As a result, the electric resistance value was 6 mf.

[Endurance Test]

An endurance test was performed in which the thermoelectric conversion element was heated in an atmosphere at 450° C., which is close to the maximum use temperature for the thermoelectric conversion element, for 2 hours. The heating caused oxidization of the outermost surfaces of the Cu plates. Accordingly, the electric resistance value was measured after the oxidized layers were polished for removal. As a result, the electric resistance value of the thermoelectric conversion element after the endurance test was 7 mΩ, which exhibited no significant change.

Figure 9:
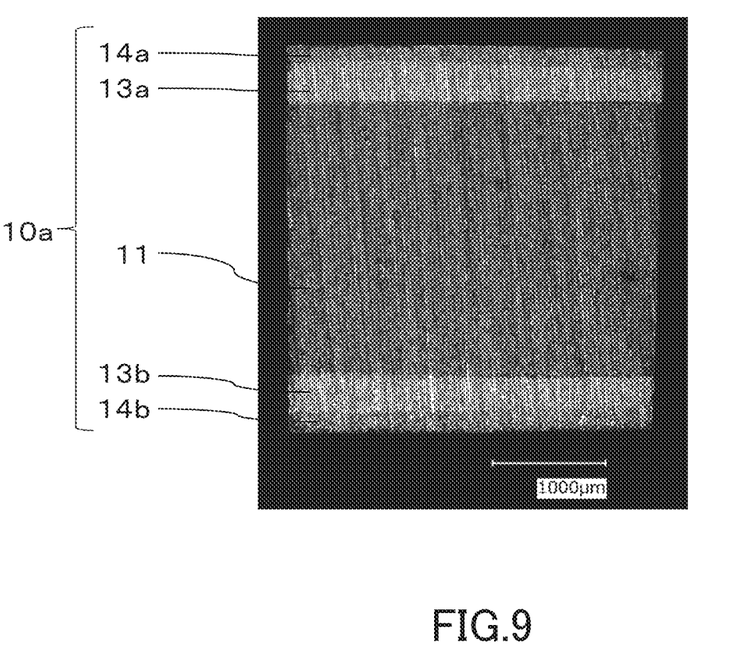
FIG. 9 is a view of a thermoelectric conversion element produced in Example 1, observed after an endurance test.

FIG. 9 shows the result of observation obtained with an optical microscope after the endurance test. No deteriorated layer was observed.

Example 2

[Production of Thermoelectric Conversion Element]

A thermoelectric conversion element according to Example 2 was produced in the same manner as in Example 1, except that a $Mg_{3.00}Na_{0.01}Sb_{1.5}Bi_{0.5}$ powder was used as the raw material of the thermoelectric conversion material.

The electric resistance value of the thermoelectric conversion element according to Example 2 was measured in the same manner as in Example 1. As a result, the electric resistance value of the thermoelectric conversion element according to Example 2 was 2.3 mΩ.

[Endurance Test]

The thermoelectric conversion element according to Example 2 was subjected to an endurance test in the same manner as in Example 1.

The electric resistance value of the thermoelectric conversion element according to Example 2 after the endurance test was measured. As a result, the electric resistance value was 2.8 mΩ, which exhibited no significant change.

Example 3

[Production of P-Type Thermoelectric Conversion Layer]

In a glove box, 1.50 g of a Mg powder, 2.51 g of a Sb powder, 4.31 g of a Bi powder, and 0.0047 g of a Na powder were weighed as the raw material. The inside of the glove box had been kept in an argon atmosphere until the thermoelectric conversion material was obtained. Next, into the glove box, the weighed powders were put into a ball mill pot together with two stainless steel balls having a diameter of ½ inch and two stainless steel balls having a diameter of ¼ inch. The ball mill pot was made of stainless steel and had an internal volume of 25 mL. Next, an opening of the ball mill pot was sealed in the glove box.

Next, the ball mill pot was taken out from the glove box and placed in a ball mill apparatus. Selected as the ball mill apparatus was Dual Mixer Mill 8000-D provided by SPEX SamplePrep. The ball mill apparatus was operated to perform grinding processing for 2 hours. This grinding processing resulted in formation of a powder of a MgSbBiNa precursor alloy. The ratio in amount of substance of Mg, Sb, Bi, and Na in the powder of the MgSbBiNa precursor alloy was Mg:Sb:Bi:Na=2.99:1.0:1.0:0.01.

Next, the ball mill pot was transferred into the glove box. In the glove box, the powder was taken out from the ball mill pot. Approximately 4 g of the powder taken out was filled into a sintering space of a carbon die, and was compacted with a carbon punch. The die was a sintering mold having a diameter of 20 mm. The die filled with the powder was put out from the argon atmosphere.

Next, the die was placed in a chamber of a spark plasma sintering apparatus. The chamber had been kept in an argon atmosphere. Next, while a pressure of 50 MPa was applied to the powder filled into the die, an electric current was applied to the die with the sintering apparatus. After the temperature of the die reached 680° C. which is the sintering temperature by the application of the electric current, the temperature was maintained for 10 minutes. Then, the heating of the die was stopped by gradually reducing the application amount of electric current. After the temperature of the die decreased to room temperature, a sintered body formed from the thermoelectric conversion material was taken out from the die. A contact surface of the sintered body which had been in contact with the punch was polished. Then, the sintered body was washed with acetone. The sintered body had a thickness of approximately 2.3 mm.

[Joining of Materials]

The thermoelectric conversion material, Cu plates washed with acetone, and an Al powder manufactured by KOJUNDO CHEMICAL LABORATORY CO., LTD. were transferred into the glove box. The Cu plates each had a diameter of 20 mm and a thickness of 0.2 mm. In the glove box, one Cu plate, 0.34 g of the Al powder, the thermoelectric conversion material, 0.34 g of the Al powder, and one Cu plate were filled in this order into a sintering space of a mold which is a carbon die, and were compacted with a punch.

The Cu plates served as the material of the metal layers, and the Al powder served as the material of the joining layers.

Next, the die was placed in a chamber of a spark plasma sintering apparatus. The chamber had been kept in an argon atmosphere. Next, while a pressure of 50 MPa was applied to the filling in the die, an electric current was applied to the die with the sintering apparatus. After the temperature of the die reached 500° C. which is the maximum joining temperature by the application of the electric current, the temperature was maintained for 30 minutes. Then, the heating of the die was stopped by gradually reducing the application amount of electric current. After the temperature of the die decreased to room temperature, a thermoelectric conversion element substrate was taken out from the die.

[Production of Thermoelectric Conversion Element]

The thermoelectric conversion element substrate having a diameter of 20 mm was cut out into 3.4-mm square elements with a diamond cutter, and the elements were washed with acetone. Thus, twelve thermoelectric conversion elements according to Example 3 were produced. The electric resistance value of the thermoelectric conversion element according to Example 3 was measured in the same manner as in Example 1. As a result, the electric resistance value of the thermoelectric conversion element according to Example 3 was 6 mΩ.

[Endurance Test]

The thermoelectric conversion element according to Example 3 was subjected to an endurance test in the same manner as in Example 1. In the endurance test, since the outermost surfaces of the Cu plates were oxidized by heating in the atmosphere, the oxidized layers of the thermoelectric conversion element were polished for removal. Then, the electric resistance value of the thermoelectric conversion element according to Example 3 was measured again. As a result, the electric resistance value was 6 mf, which was the same as before the endurance test. No change in electric resistance value was exhibited before and after the endurance test.

Figure 10:
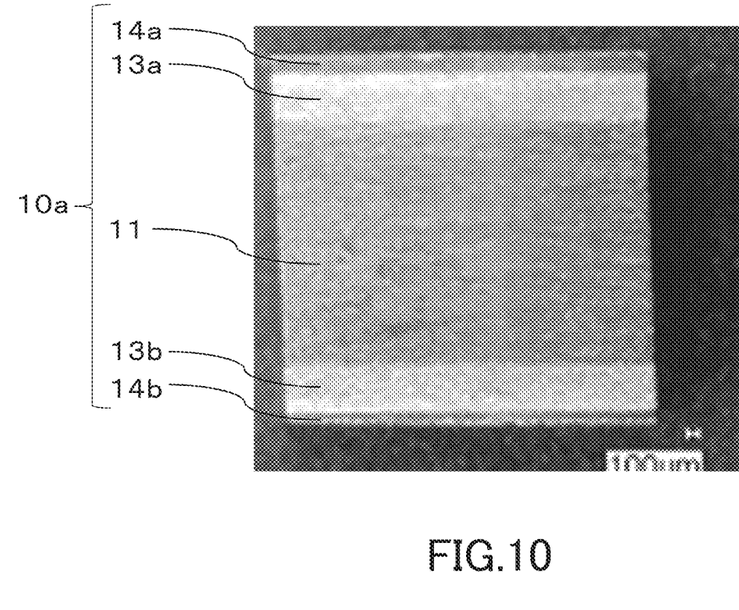
FIG. 10 is a view of a thermoelectric conversion element produced in Example 3, observed after an endurance test.

FIG. 10 shows the result of observation on the cross section of the thermoelectric conversion element, obtained after the endurance test. The thermoelectric conversion element had a thickness of approximately 3.4 mm. The P-type thermoelectric conversion layer 11 containing Mg, Sb, and Bi had a thickness of approximately 2.1 mm. The metal layer 14 formed of a Cu plate had a thickness of approximately 150 μm. The joining layer 13 formed of Al had a thickness of approximately 500 μm. No deteriorated layer was observed at the interface between the joining layer and the P-type thermoelectric conversion layer.

Example 4

A thermoelectric conversion element according to Example 4 was produced in the same manner as in Example 3, except that a CuZn alloy powder manufactured by KOJUNDO CHEMICAL LABORATORY CO., LTD. was used as the material of the metal layers. The CuZn alloy powder contained 65% of Cu and 35% of Zn on a mass basis. To form each of one pair of metal layers, 0.2 g of the CuZn alloy powder was used.

The electric resistance value of the thermoelectric conversion element according to Example 4 was measured in the same manner as in Example 1. As a result, the electric resistance value of the thermoelectric conversion element according to Example 4 was 4 mΩ. The thermoelectric conversion element according to Example 4 was subjected to an endurance test in the same manner as in Example 1.

After the endurance test, the outermost surfaces of the thermoelectric conversion element according to Example 4 were polished. Then, the electric resistance value of the thermoelectric conversion element was measured. As a result, the electric resistance value was 4 mΩ, which was the same as before the endurance test. Furthermore, the thermoelectric conversion element according to Example 4, which used a CuZn alloy as the metal layers, had thin oxidized layers on the outermost surfaces formed in the endurance test, as compared with the thermoelectric conversion element according to Example 3, which used a simple substance of Cu as the metal layers.

Comparative Example 1

[Production of Thermoelectric Conversion Element]

A thermoelectric conversion element according to Comparative Example 1 was produced in the same manner as in Example 1, except that 1 g of a Ag powder manufactured by KOJUNDO CHEMICAL LABORATORY CO., LTD. was used as the material of the joining layers and the maximum joining temperature of 400° C. was maintained for 30 minutes. The electric resistance value of the thermoelectric conversion element according to Comparative Example 1 was measured in the same manner as in Example 1. As a result, the electric resistance value of the thermoelectric conversion element according to Comparative Example 1 was 11 mf.

[Endurance Test]

Figure 11:
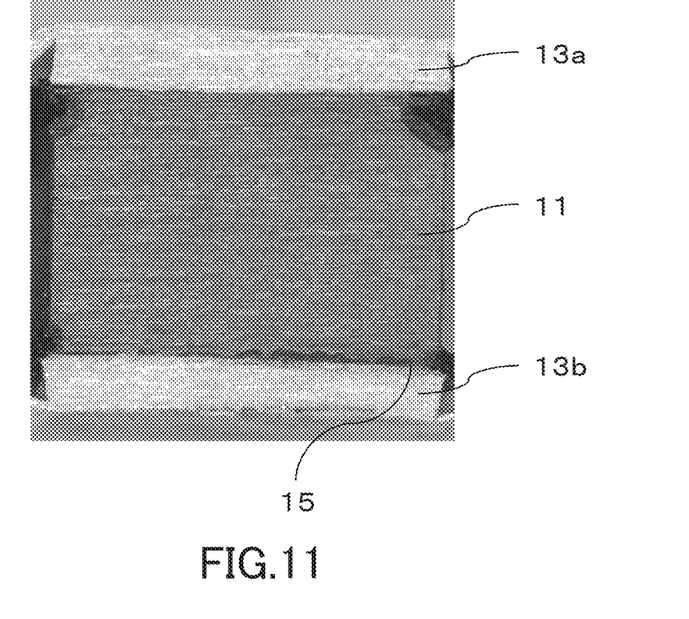
FIG. 11 is a view of a thermoelectric conversion element produced in Comparative Example 1, observed after an endurance test.
Figure 12:
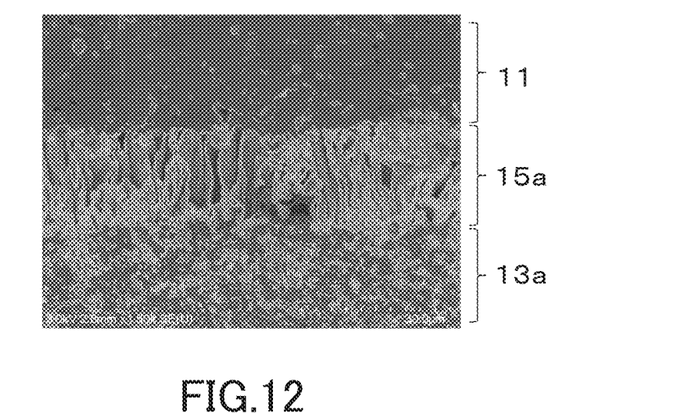
FIG. 12 is a view of the thermoelectric conversion element produced in Comparative Example 1, observed with a scanning electron microscope (SEM) after the endurance test.

The electric resistance value of the thermoelectric conversion element according to Comparative Example 1, which was measured after the endurance test as in Example 1, was 41 mΩ. It was ascertained that the electric resistance value had increased by 30 mΩ after the endurance test. FIG. 11 shows the result of observation on the thermoelectric conversion element according to Comparative Example 1, obtained after the endurance test. In FIG. 11, a deteriorated layer 15 was observed between the joining layer 13a formed of Ag and the P-type thermoelectric conversion layer 11 and between the joining layer 13b and the P-type thermoelectric conversion layer 11. Then, FIG. 12 shows a result of detailed observation on a portion of the deteriorated layer with a SEM. For this observation, a field emission SEM (FE-SEM) SU8220 manufactured by Hitachi High-Technologies Corporation was used. It was ascertained that a porous interfacial layer 15a was formed between the joining layer 13a and the P-type thermoelectric conversion layer 11. It is considered that the electric resistance of the thermoelectric conversion element increased by the formation of this porous interfacial layer.

Comparative Example 2

[Production of Thermoelectric Conversion Element]

A thermoelectric conversion element substrate according to Comparative Example 2 was produced in the same manner as in Example 1, except that an N-type $Mg_{3.2}Sb_{1.5}Bi_{0.49}Te_{0.01}$ powder was used as the raw material of the thermoelectric conversion material. An attempt was made to cut out the thermoelectric conversion element substrate according to Comparative Example 2 into approximately 3.4-mm square elements with a diamond cutter. However, Cu forming the metal layers was peeled off from the entire surface of the substrate during the cut-out. Thus, no thermoelectric conversion element could be produced.

Comparative Example 3

[Production of Thermoelectric Conversion Element]

A thermoelectric conversion element according to Comparative Example 3 was produced in the same manner as in Example 1, except that an AlSi powder manufactured by HIKARI MATERIAL INDUSTRY CO., LTD was used as the material of the joining layers and the maximum joining temperature of 420° C. was maintained for 30 minutes. The AlSi powder contained 88% of Al and 12% of Si on a mass basis.

The electric resistance value of the thermoelectric conversion element according to Comparative Example 3 was measured in the same manner as in Example 1. As a result, the electric resistance value of the thermoelectric conversion element according to Comparative Example 3 was 12 mΩ.

[Endurance Test]

The thermoelectric conversion element according to Comparative Example 3 was subjected to an endurance test in the same manner as in Example 1, and then was taken out from a test apparatus at room temperature. As a result, the thermoelectric conversion element had been decomposed, and therefore its resistance value could not be measured.

INDUSTRIAL APPLICABILITY

The thermoelectric conversion element of the present disclosure can be used for various applications including applications of conventional thermoelectric conversion elements.

What is claimed is:

1. A thermoelectric conversion element comprising:
   a P-type thermoelectric conversion layer;
   a first metal layer;
   a second metal layer;
   a first joining layer joining a first face of the P-type thermoelectric conversion layer and the first metal layer; and
   a second joining layer joining a second face of the P-type thermoelectric conversion layer and the second metal layer, wherein:
   the P-type thermoelectric conversion layer comprises a thermoelectric conversion material, the thermoelectric conversion material containing Mg and at least one selected from the group consisting of Sb and Bi,
   the first metal layer and the second metal layer each comprise Cu or a Cu alloy, and
   the first joining layer and the second joining layer each comprise an Al alloy containing 70.0 atm % or less of Mg.

2. The thermoelectric conversion element according to claim 1, wherein
   the thermoelectric conversion material is a $Mg_3(Sb,Bi)_2$-based thermoelectric conversion material including Mg, Sb, and Bi.

3. The thermoelectric conversion element according to claim 1, wherein
   the thermoelectric conversion material has a $La_2O_3$-type crystal structure.

4. The thermoelectric conversion element according to claim 1, wherein
   the thermoelectric conversion material contains Na as a dopant.

5. The thermoelectric conversion element according to claim 1, wherein
   the Al alloy further contains Ca.

6. A thermoelectric conversion module comprising:
   a P-type thermoelectric conversion element that is the thermoelectric conversion element according to claim 1; and
   an N-type thermoelectric conversion element, wherein
   the P-type thermoelectric conversion element and the N-type thermoelectric conversion element are electrically connected in series.

7. The thermoelectric conversion module according to claim 6, wherein
   the N-type thermoelectric conversion element comprises:
   an N-type thermoelectric conversion layer;
   a third metal layer;
   a fourth metal layer;
   a third joining layer joining a third face of the N-type thermoelectric conversion layer and the third metal layer; and
   a fourth joining layer joining a fourth face of the N-type thermoelectric conversion layer and the fourth metal layer, wherein:
   the N-type thermoelectric conversion layer comprises a thermoelectric conversion material, the thermoelectric conversion material containing Mg and at least one selected from the group consisting of Sb and Bi,
   the third metal layer has the same composition as the first metal layer, and
   the fourth metal layer has the same composition as the second metal layer.

* * * * *